US008736606B2

(12) United States Patent
Ramalingam

(10) Patent No.: US 8,736,606 B2
(45) Date of Patent: May 27, 2014

(54) METHOD AND APPARATUS TO CREATE 3-DIMENSIONAL COMPUTER MODELS OF PERSONS FROM SPECIALLY CREATED 2-DIMENSIONAL IMAGES

(76) Inventor: SathyaKumar Andre Ramalingam, Zumbrota, MN (US)

( * ) Notice: Subject to any disclaimer, the term of this patent is extended or adjusted under 35 U.S.C. 154(b) by 447 days.

(21) Appl. No.: 13/017,019

(22) Filed: Jan. 30, 2011

(65) Prior Publication Data
US 2011/0191070 A1    Aug. 4, 2011

Related U.S. Application Data

(60) Provisional application No. 61/337,282, filed on Feb. 1, 2010.

(51) Int. Cl.
*G06T 17/00*    (2006.01)
*G06T 15/00*    (2011.01)
*G06K 9/00*    (2006.01)
*G06K 9/20*    (2006.01)

(52) U.S. Cl.
USPC ............ 345/420; 345/419; 382/111; 382/154

(58) Field of Classification Search
CPC ..... G06T 19/00; G06T 17/00; G06T 2210/16; G06T 2200/08; G06T 15/00
USPC .......................................... 345/419; 382/154
See application file for complete search history.

(56) References Cited

U.S. PATENT DOCUMENTS

| 6,442,419 | B1 | 8/2002 | Chu et al. | |
|---|---|---|---|---|
| 7,218,752 | B2 | 5/2007 | Tsai et al. | |
| 7,584,122 | B2 | 9/2009 | Kozinn | |
| 8,284,202 | B2 * | 10/2012 | Hodgins et al. | ............... 345/473 |
| 2004/0227752 | A1 * | 11/2004 | McCartha et al. | ............ 345/419 |
| 2007/0182736 | A1 * | 8/2007 | Weaver | .......................... 345/420 |
| 2008/0071507 | A1 * | 3/2008 | Hodgins et al. | .................. 703/6 |

OTHER PUBLICATIONS

Scholz, V., Stich, T., Keckeisen, M., Wacker, M., & Magnor, M., (Sep. 2005), "Garment Motion Capture Using Color-Coded Patterns", Computer Graphics Forum (vol. 24, No. 3, pp. 439-447), Blackwell Publishing, Inc.*
Scholz, V., Stich, T., Keckeisen, M., Wacker, M., & Magnor, M., 2005, "Garment motion capture using color-coded patterns", ACM SIGGRAPH 2005 Sketches (SIGGRAPH '05), Juan Buhler (Ed.), ACM, New York, NY, USA, Article 38.*

* cited by examiner

*Primary Examiner* — Ulka Chauhan
*Assistant Examiner* — Roberta D Prendergast
(74) *Attorney, Agent, or Firm* — Mueting, Raasch & Gebhardt, P.A.

(57) ABSTRACT

A method to create a computer retrievable three dimensional model of a person that can be used as a replacement for manual measurements in the garment industry. The method uses a garment which has geometrical patterns, such as a grid pattern. The garment also contains marks that would identify landmark locations for identifying geodetic points on the person wearing it and thus could be aligned to predetermined points when wearing. A calibrated set of images are captured by multiple cameras with the person wearing this garment. These images are analyzed by a computer program which will calculate the exact spatial location of points along the geometric pattern, thus recreating the measurements of the person. A model thus created can be used in multiple industries such as, but not limited to the garment industry.

20 Claims, 3 Drawing Sheets

METHOD AND APPARATUS TO CREATE 3-DIMENSIONAL COMPUTER MODELS OF PERSONS FROM SPECIALLY CREATED 2-DIMENSIONAL IMAGES

CROSS-REFERENCE TO RELATED APPLICATIONS

Provisional application No. 61/337,282 filed on Feb. 1, 2010

STATEMENT REGARDING FEDERALLY SPONSORED RESEARCH OR DEVELOPMENT

None

REFERENCE TO A SEQUENCE LISTING, A TABLE, OR A COMPUTER PROGRAM, LISTING COMPACT DISC APPENDIX

None

BACKGROUND OF THE INVENTION

1. Field of Invention

This application relates to computer based 3D human modeling particularly for the garment industry. In addition, the invention can be applied to design and retail industries.

2. Description of Prior Art

The following is a tabulation of some prior art that presently appears relevant:

| U.S. Patents | | | |
|---|---|---|---|
| Pat. No. | Kind Code | Issue Date | Patentee |
| 7,584,122 | B2 | Sep. 1, 2009 | Kozinn |
| 7,218,752 | B2 | May 15, 2007 | Tsai et al. |
| 6,442,419 | B1 | Aug. 27, 2002 | Chu et al. |

In the garment industry, consumers often find it difficult to purchase a garment that fits their exact body shape. Take for example a pair of pants. They come in a few standard sizes, and a person gets to choose one of these sizes. There are a large number of people whose body shapes do not conform to these standardized shapes. This is largely due to the absence an automated, non-intrusive, commercial method that has the ability to determine the 3-Dimensional (3D) shape of a person who is looking to make a garment purchase; and there is no computerized way for an individual to test the fit of the hundreds of garments in a store for his or her shape. No such method or apparatus to construct the 3D model of a person wishing to purchase a garment is available today at any leading department store.

However, the technology to create 3D models currently exists. The technology mostly used to create 3D model constructions for the purposes of garment fitting are based on body scanning techniques. Scanning techniques provide an accurate set of data points, but may not provide consistent, reliable set of body landmarks that identify the points of geodetic measurement for every individual, every time. In addition, there is difficulty in turning the large amount of data to a useful set of data-points. In addition, geodetic measurement is based on preset mathematical models, and tailoring the landmark points based on individual uniqueness is not economically viable. The data is applicable for surveys and creating probabilistic models, but may not be an alternative for manual measurement for the purposes of creating a garment.

Another technology that has been used to create 3D imaging that may be of interest is based on 2D to 3D conversions. However, these 2D to 3D conversions are targeted for gaming and toward entertainment value. There are no geodesics or anthropometrics involved as relevant to human modeling in the garment industry.

There is no commercial method currently used widely to convert a 2D image to a corresponding real time 3D image that can create a replication of anthropometric measurements for the purposes of modeling a human form.

Advantages

One or more aspects of this invention are to provide a computerized, non-intrusive apparatus and method that has the ability to gather a 3D shape of individuals swiftly and economically; such a computerized 3D model can be applied in manufacturing, fitting, or in pattern making of a garment for a custom fit. Further, this model can also be fed into other applications such as computer aided design (CAD) for applying this model to test the fit of the hundreds of garments in a given store against the model. In addition, there are several other applications outside of garment industries, where a 3D computerized model of a willing participant can be of use. A 3D computerized model can be stored, and hence has all of the advantages of a readable/writable file. This method and apparatus is written for a single person at a given time, but is applicable to other forms and objects. Another notable advantage is that the landmarks for anthropometric measurement of the human body can be customized prior to each modeling.

BRIEF SUMMARY OF THE INVENTION

In accordance with one embodiment, a 3D human modeling is described which is based on 2D images of a person. The 2D images are captured in a photo-chamber for the person wearing a garment that has specific, predetermined, calculated, and calibrated geometric patterns. When worn on a human body, the geometric patterns occupy a three dimensional space, and the coordinates of this three dimensional space is calculated using a computer program part based on the patterns' projection as a 2 dimensional object on the cameras present in the photo-chamber.

BRIEF DESCRIPTION OF THE SEVERAL VIEWS OF THE DRAWING

In the drawings, closely related figures have the same number, but different alphabetic suffixes

DRAWINGS

Reference Numerals

Figure 1:
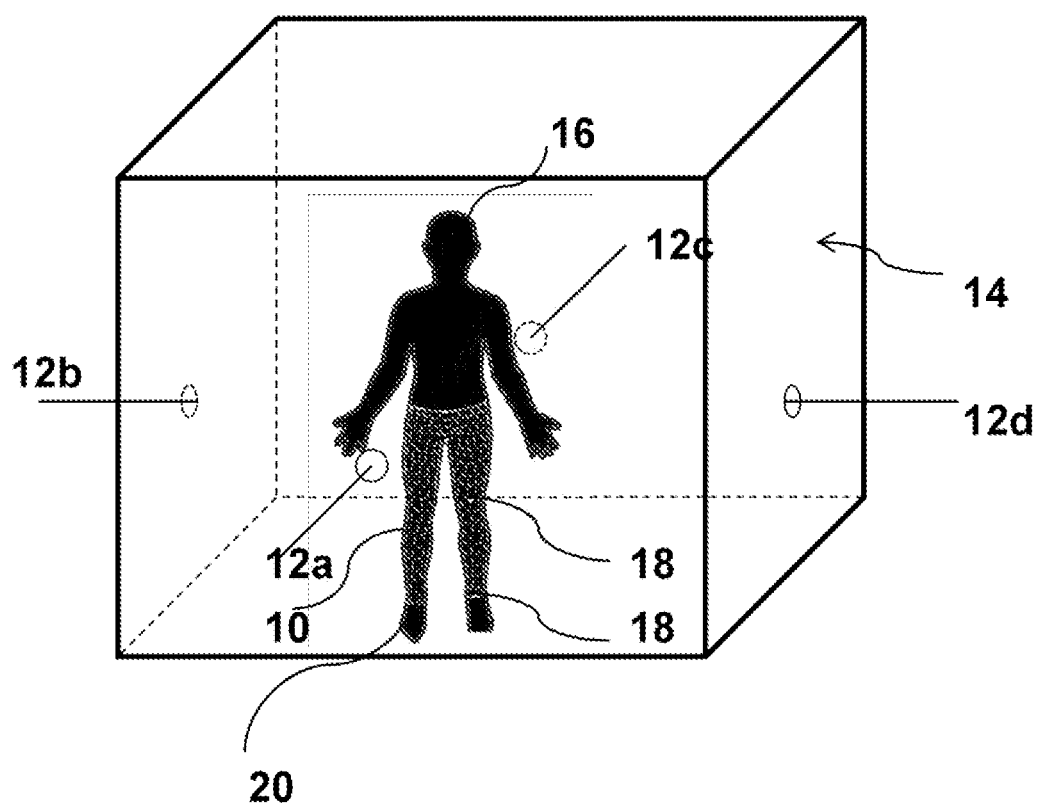
FIG. 1 is a representation of the preferred embodiment of the apparatus showing a real person wearing a garment for the lower body with a grid-like pattern in the photo-chamber. Image is not to scale

10 tight fitting garment with geometric patterns (grid-like pattern for preferred embodiment)

12 camera positions (12*a*, 12*b*, 12*c* and 12*d*)

14 photo chamber
16 person wearing the garment—a willing participant
18 body landmarks identified by a unique geometric shape or color, different from the geometric pattern on the rest of the garment
20 lines that form the grid like pattern
22 an XY plane
24 an enlarged view of a single line that forms the grid-like pattern on the garment
26 the z-axis projection of the line as in 24 as calculated by the computer program
28 the xy projection of the line as in 24 as captured by the image in one of 12a, 12b, 12c or 12d

DETAILED DESCRIPTION OF THE INVENTION

Preferred Embodiment

Figure 2:
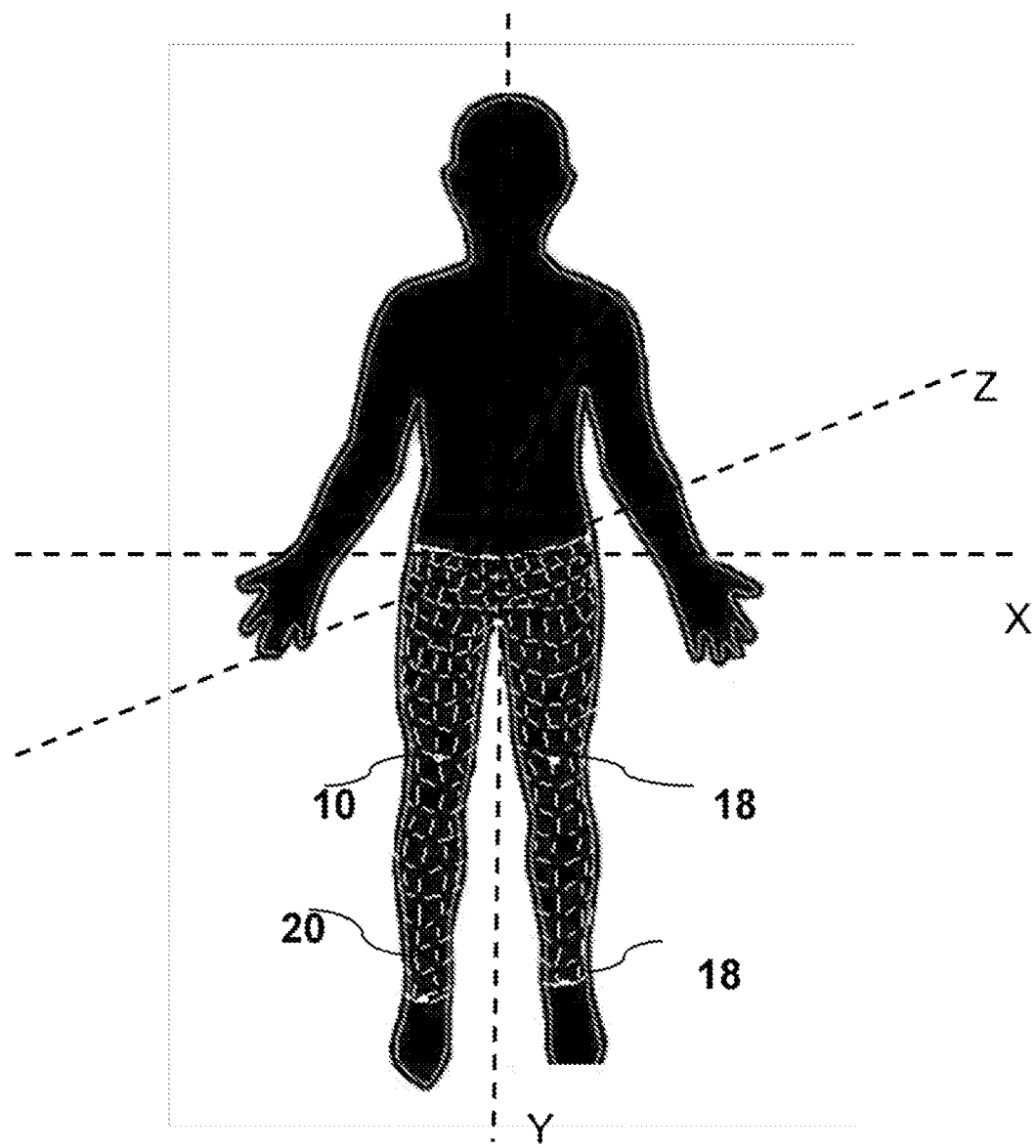
FIG. 2 shows a representation of an image captured by the camera located in the front of the real person for capturing the lower body dimensions. This Frontal Image is not to scale

The invention consists of creating a 3D computer retrievable model of an individual from specially created 2 dimensional images of the same person, where-in the 3D image is captured in a photo-chamber 14 like the one shown in FIG. 1. The computer model is requested by the person 16, and he/she is a willing participant. The specialized 2D images as shown in FIG. 2 are created for the lower body by capturing calibrated photos of a person, who wears tight fitting clothing that has specific geometrical patterns.

In the preferred embodiment, the geometric pattern consists of lines of different lengths and widths, almost forming a grid like pattern 20. The shape and size of each line depends on the calibration of the computer program that reads these images. Further, each embodiment of the garment also contains distinct geometrical and/or shapes that serve as a body landmark 18. As the garment is worn, these landmarks can be adjusted such that they are located at specific points on the body. For example, one landmark can be located at the center of the left knee.

The invention consists of 3 parts, and they are described further as follows.

The first part is the garment made of flexible material 10 (e.g. spandex) that has grid like patterns 20 on it. The garment has to tightly fit the person that is wearing it. A few different garment sizes may be created such that at least one of the sizes may fit a given person. By fit we mean that the garment stretches a little when worn, and does not have any wrinkles when the images are taken. However, it is also elastic enough to regain its original dimensions once taken off. The grid-like pattern is a calculated set of mostly perpendicular lines the captured image of which is similar to FIG. 2. Each line is of specific length, and can vary over the body of the dress, in order that they are distinguishable by a computer program. When not worn, each line would be of a certain length, and can be measured to ensure that they did not extend when not worn. When worn, the dress stretches, and the individual lines also stretch. The lines may be of different lengths as required to calibrate the computer model and to use that to measure the exact measurements.

The second part is a process that involves taking the images of the individual wearing the above mentioned garment. For the preferred embodiment, images are taken from 4 different cameras 12 positioned perpendicular to each other as shown in FIG. 1. The cameras are placed in calculated and calibrated distances in the front 12a, back 12c, and the 2 sides of the person 12b, 12d. Thus the scope of these cameras covers most of the exposed body area of the person with some overlap area among the captured images. This overlap area is used to further coordinate the spatial location of each of the lines. The number of photos and/or cameras required may vary depending on how well the computer model is able to read the photo images. One captured image of camera at 12a may look like what is shown in FIG. 2, with visible landmark locations 18, garment 10 and the grid-like pattern 20.

The third part is a computer program which is able to read individual pixels of the photo images, and is automated to read the stretch and angle of each line on the dress. Each image is processed for coordinating all the landmark points and the grid lines. Based on the angle and the length of each of these lines then, the computer is able to calculate the x, y and z coordinates of each of those lines, which are then used to form the 3D model of the human form that was in the picture.

To address the mathematics of this, let us discuss the picture taken from the front, as shown in FIG. 2. Here, the X-axis goes across the body, and the Y-axis goes along the length of the body. The Z-axis then forms along the depth of the body. The frontal image contains a 2-dimensional picture of the garment and the person as seen from the front, and will look something like FIG. 2, probably with many more lines of different lengths, and with a much higher resolution. Each line on this picture makes an angle from 0 to 360 with each of the coordinates X, Y and Z. Directly from this 2D image, the X and Y coordinates are easily calculated by counting the number of pixels traversed in the X-direction and the Y-direction. Also, the length of the line in this image is the length in 2-D or a given 2 dimensional plane. The 2 dimensional plane will depend on the position of the camera. Further, the length as captured in the image is different from the real-time length, and depends upon the angle that line makes with the axis perpendicular to the 2 dimensional plane of the camera. For simplicity, let us consider the 2 dimensional plane to be in the XY-plane 22, and the Z-axis will be perpendicular to this plane.

Figure 3:
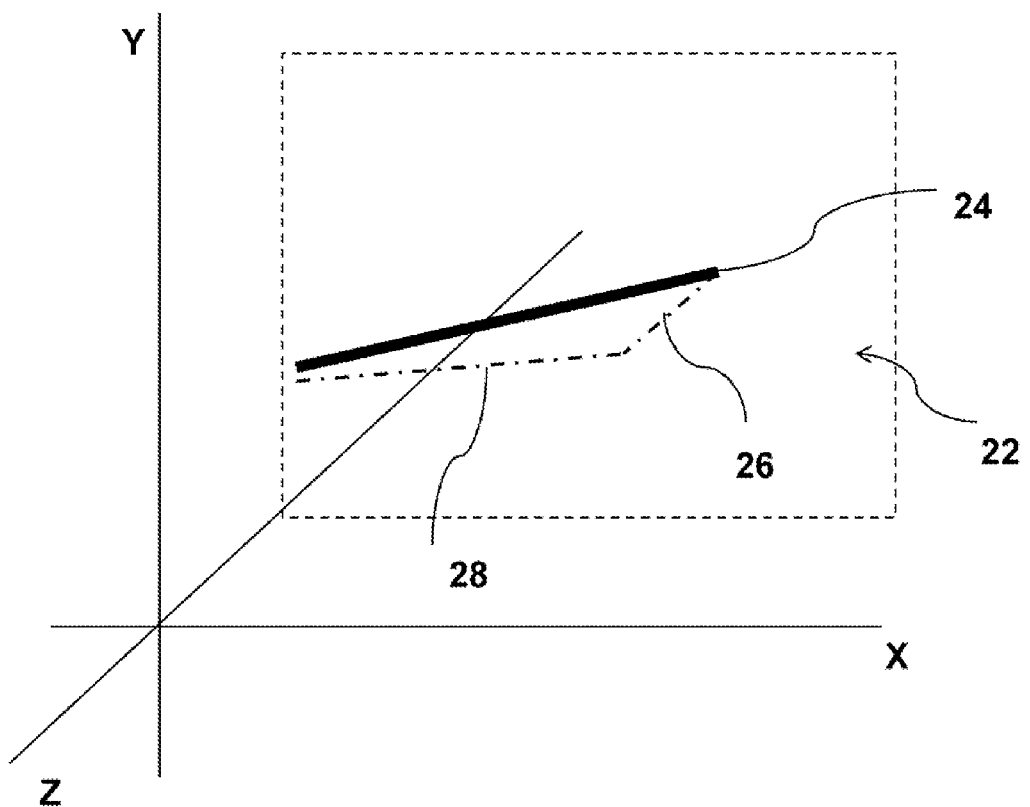
FIG. 3 shows an enlarged view of one of the lines in three dimensional space. Image is not to scale

Consider FIG. 3. A single line 24 that makes an angle with each of the three coordinates is shown. Let us take the actual 2D length measured and as seen in the frontal image 28 as len2D'. Since we know the length of each line on the garment, and the stretch of each line based on a calibration line (which can be a separate longer line), we can calculate the actual physical 3D length of the line 24 to be a given value, say len3D'. In essence, len3D' will be a product of 'sf' and lenActuar, where 'sf' is a Stretch Factor which is usually greater than or equal to 1 and lenActuar is the length of line before being worn. The value 'sf' can be calculated by embedding a control line within the geometrical pattern. In addition, if the Z-coordinate 26 is taken as 'z', then z will equal the root of the sum of the squares of Len3D and Len2D based on a simple Pythagorean theorem. The real length of the line when stretched, Len3D can be calibrated sufficiently such that the entire line in its space can be observed as a straight line and not a curve.

Thus we have all the 3 coordinates of a given grid-line on the garment. Similarly, each line on the garment can be calculated and entered to form a 3 dimensional representation. The photos taken from different angles help to further calibrate and coordinate all the calculations.

An ideal process flow would start with a garment buyer who is looking to model his/her shape. He or she would wear the garment described above, and pose in the photo-chamber as designed for the particular set of cameras. Photos of this pose form the 2D image base, which in turn become the input for the computer program that then converts these set of 2D images to a modifiable 3D computer model of the person, based on the mathematics described herewith.

The computer model thus created consists of sufficient points in a 3-dimensional space which when plotted on an XYZ coordinate system, will recreate the dimensions of the person. The model also has the landmark points, so this can further be used to generate measurements that are needed for garment manufacturing, such as, but not limited to garment fitting, pattern making, garment design and manufacturing. As another example of application of this invention, in the retail industry a model thus created can be used to test the fit for hundreds of existing garments without having to wear each one. Further examples could be stated in anthropometric databases and surveys.

Alternative Embodiments

Alternative embodiments are possible by altering the geometrical patterns, shapes and colors and also the number of cameras. Modification to the mathematical is necessary when the geometric pattern is altered. Further embodiments may include extension of these principles to inanimate objects. Embodiments which can be applied to parts of a human body are also possible, such as modeling feet dimensions, or head, arms dimensions and so on.

What is claimed is:

1. A method of creating a 3D scale, computer retrievable model of a person using 2D images of said person, wherein the method comprises:
    using a computer to perform:
    acquiring a plurality of 2D images of a person wearing a tightly fitted garment comprising a flexible material, wherein the garment comprises a grid like geometrical pattern having predetermined dimensions when the garment is not worn, and further wherein dimensions of the grid like geometrical pattern stretch when the garment is worn; and
    creating a 3D model of the person wearing the garment based on at least the dimensions of the grid like geometrical pattern when stretched as captured on the 2D images of the person wearing the garment and the predetermined dimensions of the grid like geometrical pattern when the garment is not worn.

2. The method according to claim 1, wherein the garment comprises a grid like geometrical pattern of lines having predetermined dimensions when the garment is not worn, and further wherein creating the 3D model of the person wearing the garment comprises creating the 3D model of the person based on at least a change in the line lengths in the 2D images of the person wearing the garment as a result of the stretch of the garment when worn and captured in the 2D images.

3. The method according to claim 2, wherein creating the 3D model of the person wearing the garment comprises creating the 3D model of the person based on at least a change in the angle of the lines in the 2D images of the person wearing the garment as a result of the stretch of the garment when worn and captured in the 2D images.

4. The method according to claim 1, wherein creating the 3D model comprises creating the 3D model at least based on a stretch factor of the flexible material of the garment.

5. The method of claim 1, wherein the method further comprises providing a chamber with a plurality of cameras positioned therein configured to provide 2D images of a person wearing the garment.

6. The method of claim 1, wherein acquiring a plurality of 2D images comprises acquiring overlapping 2D images, wherein each overlapping image comprises an image of at least a portion of the garment that includes an overlapping area with at least one other image of at least a portion of the garment.

7. The method of claim 1, wherein the garment further comprises one or more landmark identifiers, wherein the one or more landmark identifiers comprise at least one geometrical or color shape distinct from the grid like geometrical pattern of lines to identify predetermined landmarks on the human body, wherein acquiring the 2D images comprises providing a person wearing the garment, wherein providing a person wearing the garment comprises adjusting the location of the garment such that the one or more landmark identifiers are located at specific locations of the body of the person.

8. The method according to claim 1, wherein the method further comprises providing the 3D model of the person wearing the garment as a file to a computer aided design application.

9. The method according to claim 8, wherein the method further comprises using the 3D model provided to the computer aided design application to at least one of test fit a plurality of garments, make one or more patterns, manufacture one or more garments, and design one or more garments.

10. A system comprising a computer and a computer program executable on the computer to perform the method of claim 1, wherein creating the 3d model comprises analyzing the 2d images, wherein the analysis results in creation of points on a 3 dimensional coordinate system for creating the 3D model.

11. The system of claim 10, wherein the garment comprises calculated geometric patterns printed on the garment, wherein the calculated geometric patterns comprise at least the grid like pattern having predetermined dimensions when the garment is not worn, wherein dimensions of the grid like pattern stretch when the garment is worn, and further wherein the garment is configured such that a 2D image of a person wearing the garment, provides at least dimensions of the stretched grid like geometrical pattern usable to calculate 3D positions of a 3D model of the person wearing the garment.

12. The system of claim 11, wherein the garment further comprises one or more landmark identifiers, wherein the one or more landmark identifiers comprise at least one geometrical or color shapes distinct from the calculated geometric patterns on the garment to identify predetermined landmarks on the human body, wherein the one or more landmark identifiers are usable to allow a user to adjust the location of the garment such that the one or more landmark identifiers are located at specific locations of the body.

13. The system of claim 11, wherein the garment comprises a grid like pattern of lines having predetermined dimensions when the garment is not worn, wherein dimensions of the grid like pattern of lines stretch when the garment is worn, and further wherein the garment is configured such that a 2D image of a person wearing the garment provides at least dimensions of the stretched grid like pattern usable to calculate 3D positions on a 3D model of the person wearing the garment based on at least a change in the line lengths in the 2D image of the person wearing the garment as a result of the stretch of the garment when worn and captured in the 2D image.

14. The system of claim 13, wherein the garment is configured such that a 2D image of a erson wearing the garment provides at least dimensions of the stretched grid like pattern usable to calculate 3D positions on a 3D model of the person wearing the garment based on at least a change in the angles of the lines in the 2D image of the person wearing the garment as a result of the stretch of the garment when worn and captured in the 2D image.

15. The system of claim 11, wherein at least one of a shape, size and stretch of the calculated geometrical patterns in the 2D image of the garment when worn are compared with predetermined dimensions of the shape and size of the calculated geometric patterns of the garment when not worn to provide an indication of the dimension of the person wearing it.

16. The system of claim 11, wherein the garment comprises a flexible material, wherein at least a stretch factor of the garment is usable to calculate 3D positions of each line on a 3D model of the person wearing the garment.

17. The system of claim 10, wherein the system further comprises a chamber and a plurality of cameras mounted in the chamber, wherein the cameras are configured to acquire 2D images of a person wearing the garment.

18. The system of claim 17, wherein the number of cameras and location of the cameras are selected and configured to capture necessary and sufficient exposed areas of the garment to calculate the 3D model of the person.

19. The system of claim 10, wherein the 2D images captured may be static or dynamic.

20. The system comprising the computer program of claim 10, wherein the analysis results when plotted on a 3 dimensional scale render real-time dimensions of the person.

* * * * *